United States Patent [19]

Takahashi

[11] Patent Number: 5,465,057
[45] Date of Patent: Nov. 7, 1995

[54] LEVEL CONVERSION CIRCUIT FOR SIGNAL OF ECL-LEVEL

[75] Inventor: Hiroyuki Takahashi, Tokyo, Japan

[73] Assignee: NEC Corporation, Tokyo, Japan

[21] Appl. No.: 231,059

[22] Filed: Apr. 22, 1994

[30] Foreign Application Priority Data

Apr. 23, 1993 [JP] Japan .................................. 5-096360

[51] Int. Cl.$^6$ .............................................. H03L 19/0175
[52] U.S. Cl. ................................ 326/66; 326/110; 326/80
[58] Field of Search ........................ 326/66, 80, 110, 326/73

[56] References Cited

U.S. PATENT DOCUMENTS

| | | | |
|---|---|---|---|
| 4,992,681 | 2/1991 | Urakawa | 307/475 |
| 5,068,551 | 9/1991 | Bosnyak | 307/475 |
| 5,075,579 | 12/1991 | Veno | 307/475 |
| 5,103,121 | 4/1992 | Wendell | 307/475 |
| 5,287,019 | 2/1994 | Nonaka | 307/475 |

FOREIGN PATENT DOCUMENTS

| | | |
|---|---|---|
| 0146910A2 | 7/1985 | European Pat. Off. . |
| 0417786A3 | 3/1991 | European Pat. Off. . |
| 0501085A1 | 9/1992 | European Pat. Off. . |
| 4010145 | 1/1991 | Germany . |

OTHER PUBLICATIONS

European Search Report.
S. Embabi et al,; "Analysis and Optimization of BiCMOS Digital Circuit Structures"; IEEE Journal of Solid-State Circuits; vol. 26, No. 4, Apr. 1991; pp. 676–679.

*Primary Examiner*—Edward P. Westin
*Assistant Examiner*—Andrew Sanders
*Attorney, Agent, or Firm*—Whitham, Curtis, Whitham & McGinn

[57] ABSTRACT

A level conversion circuit for converting a first signal having a first amplitude into a second signal having a second amplitude that is larger than the first amplitude, includes a bipolar transistor supplied at a base thereof with the first signal, a first MOS transistor of a first channel type having a gate supplied with a bias voltage and a source-drain path connected between the emitter of the bipolar transistor and an output node from which the second signal is derived, and a second MOS transistor of a second channel type having a gate supplied with an inverted signal of the first signal and a source-drain path connected between the output node and a reference potential line. A PN junction diode is preferably inserted between the third transistor and the reference potential line.

8 Claims, 5 Drawing Sheets

LEVEL CONVERSION CIRCUIT FOR SIGNAL OF ECL-LEVEL

BACKGROUND OF THE INVENTION

The present invention relates to a level conversion circuit for a signal of an emitter-coupled-logic (ECL) level and more particularly, to such a circuit constituted of bipolar transistors and complementary metal-oxide-semiconductor transistors, i.e. a Bi-CMOS circuit, for responding to an input signal of the ECL-level to produce an output signal having an amplitude capable of driving a CMOS circuit.

As well known in the art, an ECL circuit performs a signal processing operation at a very high speed but with a relatively large power consumption, and a CMOS circuit performs a signal processing operation with small power consumption but at a relatively low speed. Accordingly, such a logic circuit is widely employed that incorporates both the ECL circuit and the CMOS circuit. In this case, a level conversion circuit is required to convert a signal of the ECL-level derived from the ECL circuit into such a signal that drives the CMOS circuit, as well known in the art.

Referring to FIG. 1, such a level conversion circuit according to a prior art is shown as a typical example. Specifically, this prior art circuit is composed of an ECL buffer circuit ECL1 and a level converter LC4. The buffer ECL1 includes a bipolar transistor Q1 supplied with an input signal IN of the ECL-level and a bipolar transistor Q2 supplied with a reference voltage VR. These transistors Q1 and Q2 are connected to form a differential circuit together with a current source I1 and load resistors R1 and R2. The true and complementary intermediate signals EO and EOB are derived from the collectors of the transistors Q2 and Q1, respectively, and supplied to emitter follower circuits composed of bipolar transistors Q41 and Q42 and current sources I41 and I42 in the level converter LC4. The emitter output of the transistor Q41 is supplied to the gates of P-channel MOS transistors M41 and M46 and the emitter output of the transistor Q42 is supplied to the gates of P-channel MOS transistors M42 and M45. A current mirror circuit composed of N-channel MOS transistors M43 and M44 is connected between the transistors M41 and M42. Similarly, a current mirror circuit composed of N-channel MOS transistors M47 and M48 is connected between the transistors M45 and M46. The true and complementary output signals OUT and OUTB are derived from the sources of the transistors M42 and M46, respectively.

With such a circuit as described above, the buffer ECL1 amplifies the amplitude, 0.8 V, of the input signal IN up to the amplitude, 1 to 1.5 V, indicative of the difference between the intermediate signals EO and EOB. The level converter LC4 further amplifies the amplitude of the signal EO (EOB) and produces the output signals OUT and OUTB which in turn drive a CMOS circuit (not shown) connected to this circuit.

The level conversion circuit is required not only to perform a desired level conversion operation but also to carry out that operation at a high speed. Considering the operation for pulling down the level of the output signal OUT or OUTB, however, it is required that the transistors M41, M43 and M44 or M45, M47 and M48 operate in sequence in that order to pull down the corresponding output signal. The level conversion speed, in particular the pull-down speed of the output signal, is thereby lowered. It is considered to make the transistors M41 to M48 operate in a linear region to enhance the conversion speed, but in that case the power consumption is in turn increased.

SUMMARY OF THE INVENTION

It is therefore an object of the present invention to provide an improved level conversion circuit utilizing a Bi-CMOS circuit.

It is another object of the present invention to provide a level conversion circuit of a Bi-CMOS type which performs a level conversion operation at a high speed with low power consumption.

A level conversion circuit according to the present invention includes a bipolar transistor, a first MOS transistor of a first channel type and a second MOS transistor of a second channel type connected in series in that order between a first voltage line and a second voltage line. The bipolar transistor receives at the base thereof an input signal to be level-converted. The first MOS transistor has a gate supplied with a bias voltage and the second MOS transistor has a gate supplied with an inverted signal of the input signal. An output signal is derived from the connection node of the first and second MOS transistors.

In operation, when the level of the signal changes toward the first voltage level at the first voltage line, the effective conductance of the first MOS transistor is increased, whereas that of the second MOS transistor is decreased. Accordingly, the output signal derived from the output terminal is changed in level toward the first voltage level. When the signal changes in level to the second voltage level at the second voltage line, on the other hand, the effective conductance of the first MOS transistor is decreased, whereas that of the second MOS transistor is increased, so that the output signal is changed in level toward the second voltage level. Thus, the input signal is level-converted and the output signal having an amplified amplitude is derived. Moreover, the level conversion operation is carried out at a high speed, because the level changing operation is performed through the minimum number of transistors.

It is preferable to insert a diode relative to the base-emitter PN junction of a bipolar transistor between the second MOS transistor and the second voltage line. In this case, each of the pull-up and pull-down operations for the output signal is performed through one MOS transistor and one PN junction representative of the base-emitter junction or diode. Accordingly, the symmetry of the output signal is achieved in both level changing operation and voltage waveform.

BRIEF DESCRIPTION OF THE DRAWINGS

The above and other objects, features and advantages of the present invention will be more apparent from the following description taken in conjunction with the accompanying drawings, wherein.

DETAILED DESCRIPTION OF THE PREFERRED EMBODIMENTS

Figure 1:
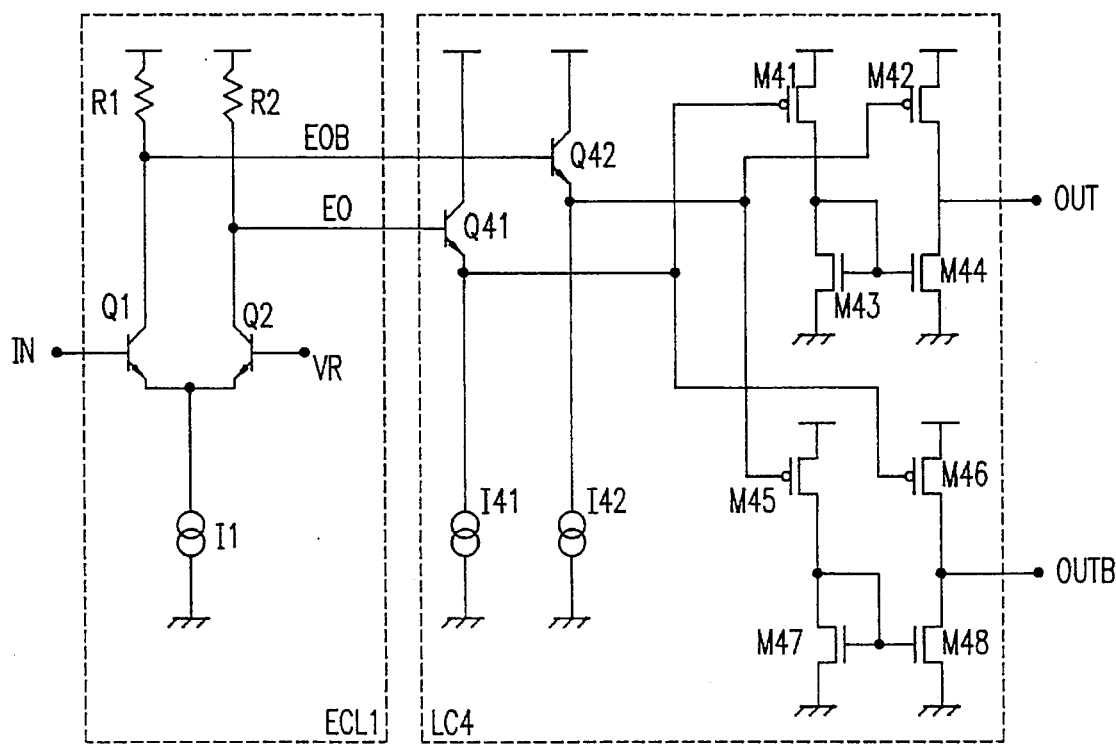
FIG. 1 is a circuit diagram illustrative of a level conversion circuit according to the prior art.
Figure 2:
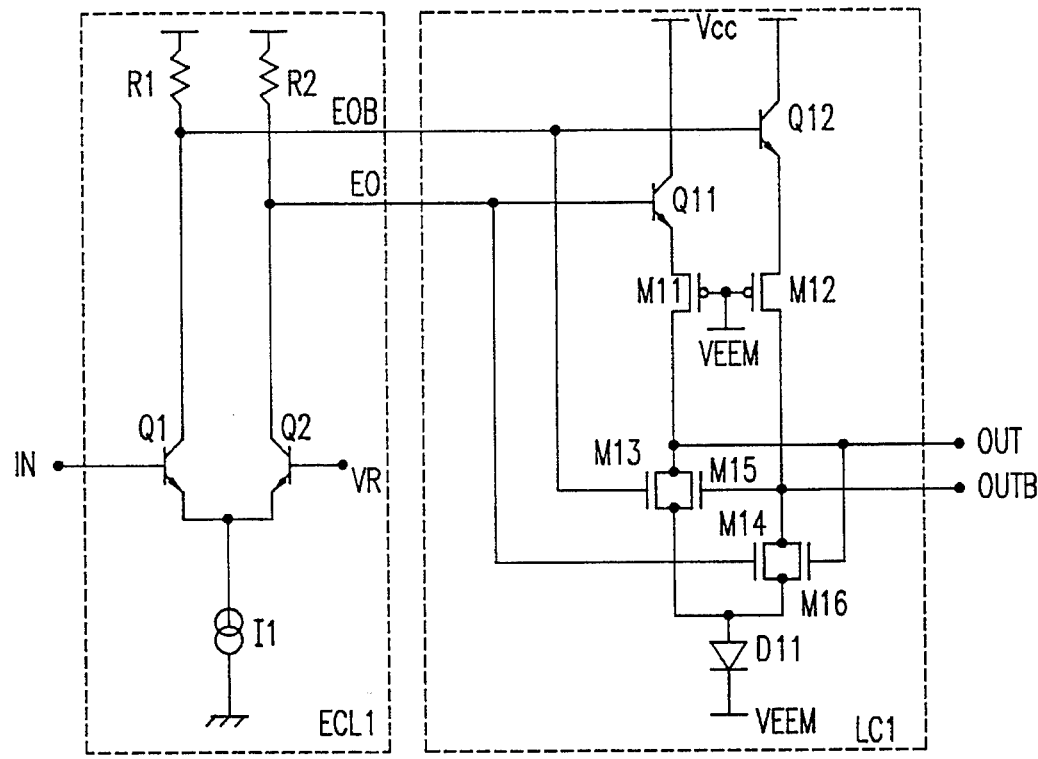
FIG. 2 is a circuit diagram illustrative of a level conversion circuit according to a first embodiment of the present invention.

Referring to FIG. 2, there is shown a level conversion circuit according to a first embodiment of the present invention, in which the same constituents as those shown in FIG. 1 are denoted by the same reference symbols to omit the further description thereof. As is apparent from the comparison between the circuits shown in FIGS. 1 and 2, the present level conversion circuit is different from the prior art in a level converter LC1. This converter LC1 includes two NPN bipolar transistors Q11 and Q12 supplied at the bases thereof with the true and complementary intermediate signals EO and EOB from the ECL buffer ECL1, respectively. The collectors of the transistors Q11 and Q12 are connected to a first voltage line having a level of VCC. The converter LC1 further includes two P-channel MOS transistors M11 and M12, four N-channel MOS transistors M13 to M16 and a diode D11. The transistor M11 is connected between the emitter of the transistor Q11 and a first output terminal from which a true output signal OUT is derived, and the transistor M12 is connected between the emitter of the transistor Q12 and a second output terminal from which a complementary output signal OUTB is derived. The gates of the transistors M11 and M12 are connected in common to a second voltage line to receive a second voltage level VEEM. This level VEEM takes the ground level. If desired, the level VEEM may take another level that is higher than the ground level. The transistors M13 and M15 are connected in parallel between the first output terminal and the anode of the diode D11 having its cathode connected to the second voltage line, and the transistors M14 and M16 are connected in parallel between the second output terminal and the anode of the diode D11. The diode D11 is made preferably by the base-emitter junction of a bipolar transistor having a collector connected to the base thereof. The gates of the transistors and M13 and M14 are connected respectively to the bases of the transistors Q12 and Q11 to receive the complementary and true intermediate signals OUTB and OUT. The gates of the transistors M15 and M16 are connected to receive the complementary and true output signals OUTS and OUT, respectively.

In operation, the input signal IN of the ECL-level (having am amplitude of 0.8 V) is first converted by the ECL buffer ECL1 into the intermediate signal EO (EOB) having an amplitude of 1 to 1.8 V, as described in connection with FIG. 1. Each of the signals OE and OEB has the high level equal to the first voltage level VCC. It is a matter of course that the intermediate signal EO (EOB) follows the change in level of the input signal IN. However, the signal OEB has a phase that is opposite to the phase of the input signal IN. The emitter levels of the transistors Q11, Q12 also follow the changes in level of the signals EO and EOB, respectively, with a difference therefrom by a base-emitter forward voltage drop which is about 0.8 V. When the signal EO is changed from the high level to the low level, the bias voltage between the gate and source of the transistor M11 is made small because the gate thereof is supplied with the second voltage level VEEM and thus constant. The transistor M11 is thereby lowered in effective conductance thereof. On the other hand, the bias voltage between the gate and source of the transistor M12 is made large, so that the effective conductance thereof is increased.

The signal EO is further supplied to the transistor M14, so that the change thereof from the high level to the low level causes the voltage between the gate and source of the transistor M14 to become small, because the source voltage thereof is fixed at a constant level that is higher than the second voltage level VEEM by the forward voltage drop (about 0.8 V) of the diode D11. The effective conductance of the transistor M14 is thereby made small. On the other hand, the signal EOB is made large the voltage between the gate and source of the transistor M13 to increase the effective conductance thereof. As a result, the true output signal OUT is changed from the high level to the low level, whereas the complementary output signal OUTB is changed from the low level to the high level. The changes in output signals OUT and OUTB cause the effective conductance of the transistors M16 and M15 to become small and large, respectively. That is, the change in level of the output signal is positively fed back. Accordingly, the change in output signal OUT (OUTB) is accelerated and further a d.c. current following through the transistors M11 to M16 is suppressed.

Figure 8:
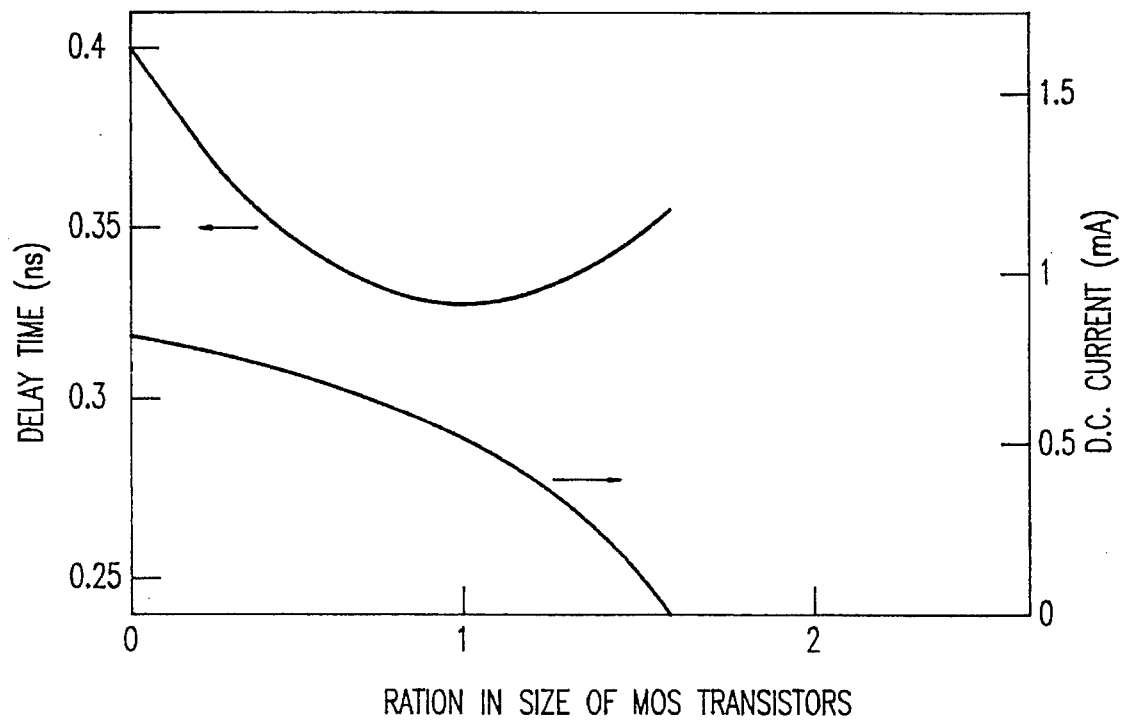
FIG. 8 is a graph indicative of transistor size dependency characteristics of the circuit shown FIG. 2 with respect to a conversion delay time and power consumption.

Referring to FIG. 8, there is shown a relationship in conversion delay time and power consumption with respect to a ratio in size between the transistors M13 and M15 or M14 and M16.

Figure 6:
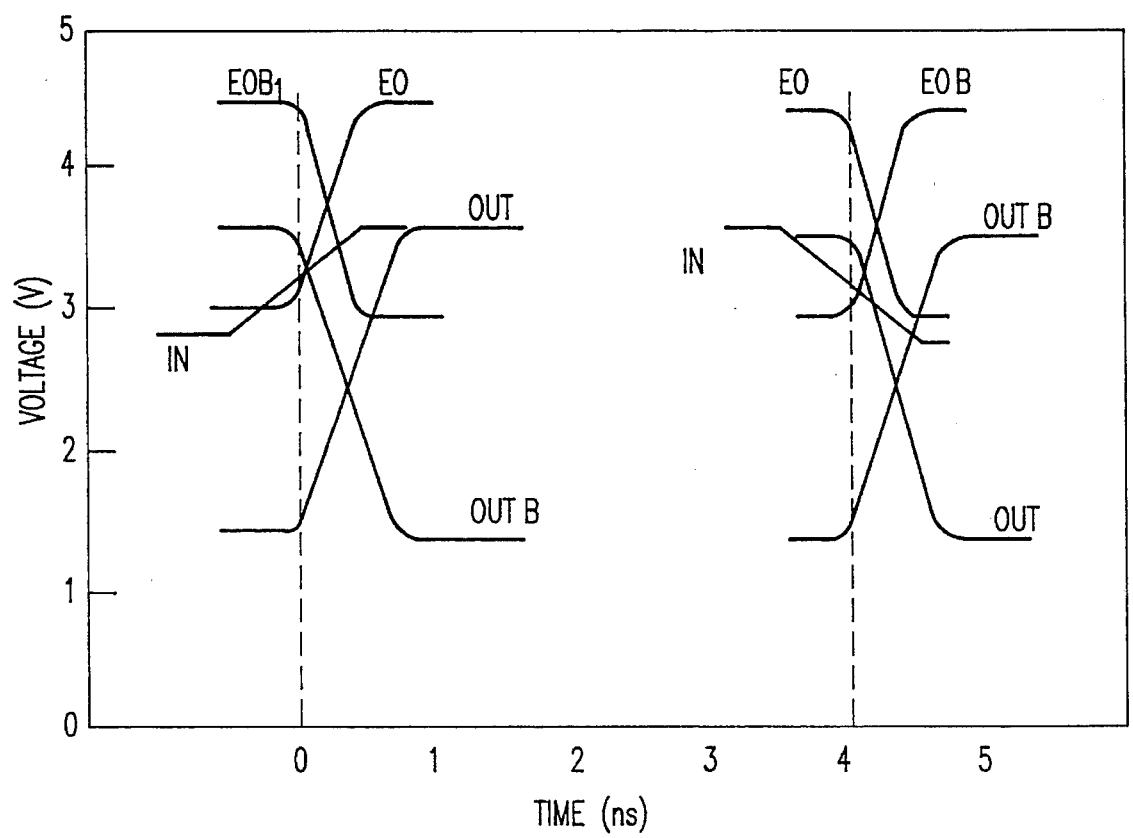
FIG. 6 is a voltage waveform diagram indicative of respective signals shown in FIG. 2.

Thus, each of the output signals OUT and OUTB takes the high level of about (VCC-VD) and the low level of about (VEEM-VD), where VD represents the base-emitter forward voltage of the transistor Q11 (Q12) and the forward voltage of the diode D11. Assuming that the level VCC is 5 V and the level VEEM is 0.5 V, the respective signals IN, EO, EOB OUT and OUTB take voltage waveforms, as shown in FIG. 6. If desired, the level VEEM may take the ground level or 0 V.

In the circuit as shown in FIG. 2, each of the transistors Q11 and Q12 functions as emitter-follower and thus operates at a very high speed, as well known in the art. Moreover, only one MOS transistor is inserted in a signal path for transferring a level change to each of the output signals OUT and OUTB. Accordingly, the change in level of each of the output signals OUT and OUTB is performed at a high speed. Furthermore, the diode D11 presents the symmetry in conversion operation as well as voltage waveform.

Figure 3:
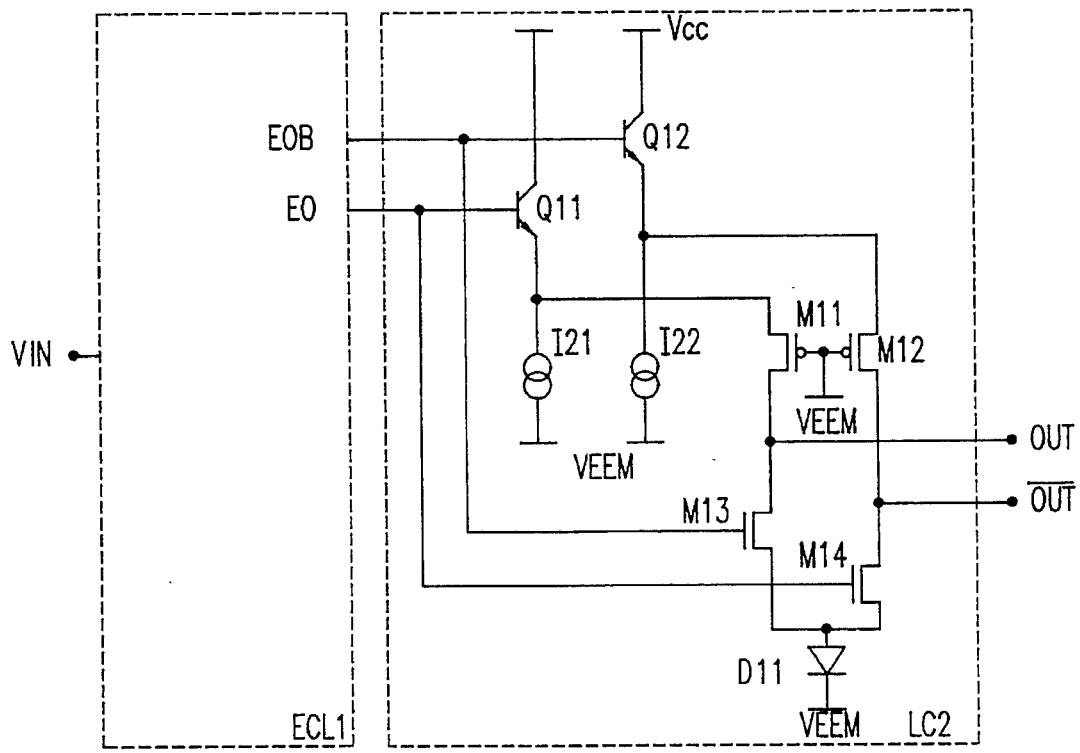
FIG. 3 is a circuit diagram indicative of a second embodiment of the present invention.

Turning to FIG. 3, a level conversion circuit according to a second embodiment of the present invention is slightly different in the converter from that shown in FIG. 2. That is, as shown by LC2 in this drawing, the converter of the present circuit includes two current sources I21 and I22. The current source I21 is connected between the emitter of the transistor Q11 and the second voltage line and the current source I22 is connected between the emitter of the transistor Q12 and the second voltage line. The MOS transistors M15 and M16 shown in FIG. 2 are omitted from the present converter LC2, however.

According to this circuit, although a power consumption is increased more or less by the current sources I21 and I22, the change in level of each of the emitters of the transistors Q11 and Q12, i.e. each of the sources of the transistors M11 and M12, is attained at a high speed by the current sources I21 and I22. The level conversion speed is thereby improved as compared to the circuit shown in FIG. 2.

Figure 7:
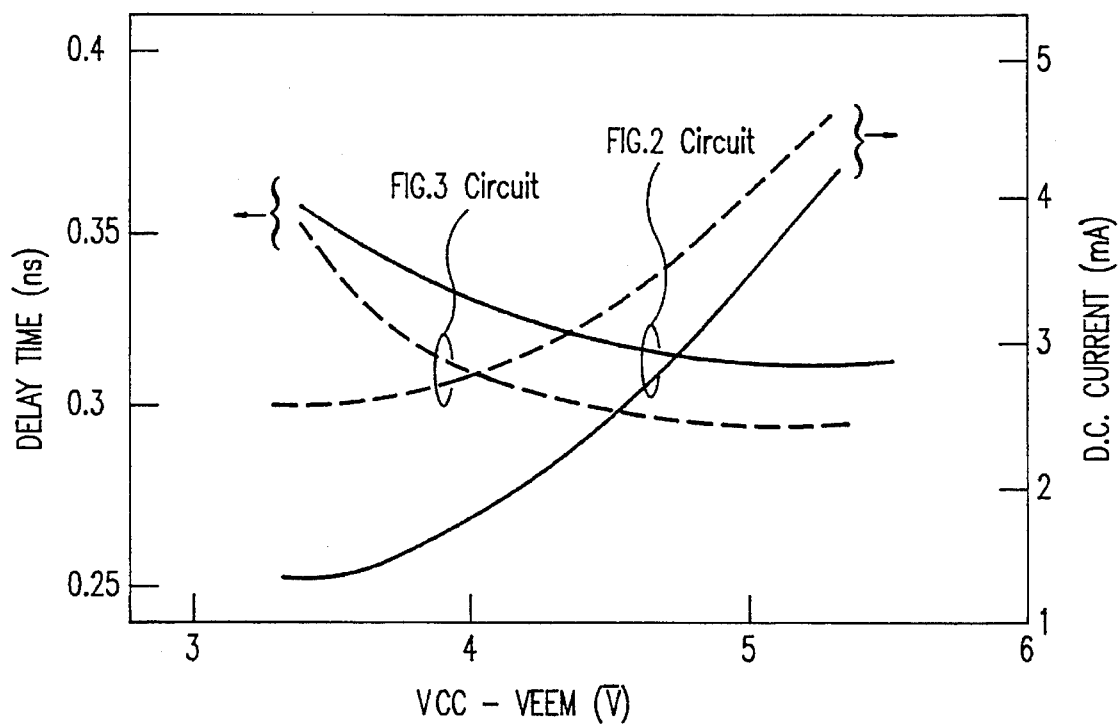
FIG. 7 is a graph indicative of power supply voltage dependency characteristics of the circuits shown in FIGS. 2 and 3 with respect to a conversion delay time and power consumption.

FIG. 7 shows a comparison between the circuits of FIG. 2 and FIG. 3 with respect to changes in conversion delay time and power consumption to a power supply voltage represented by (VCC-VEEM).

Figure 4:
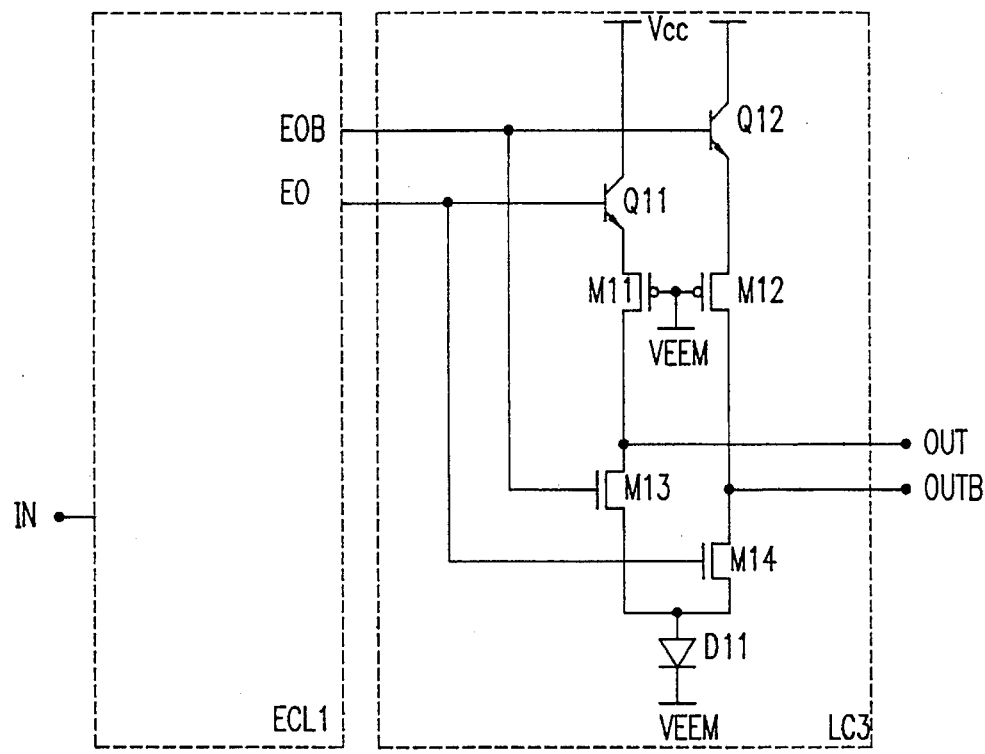
FIG. 4 is a circuit diagram indicative of a third embodiment of the present invention.

Referring to FIG. 4, a level conversion circuit according to a third embodiment of the present invention is different from the circuit shown in FIG. 2 in that the transistors M15 and M16 are omitted. The present circuit is therefore inferior to the circuit of FIG. 2 in both an operation speed and power consumption. However, the present circuit is superior to the prior art circuit of FIG. 1, as described in connection with FIG. 2. Moreover, this circuit is constructed with a smaller number of transistors than the circuits shown in FIGS. 1-3.

Figure 9:
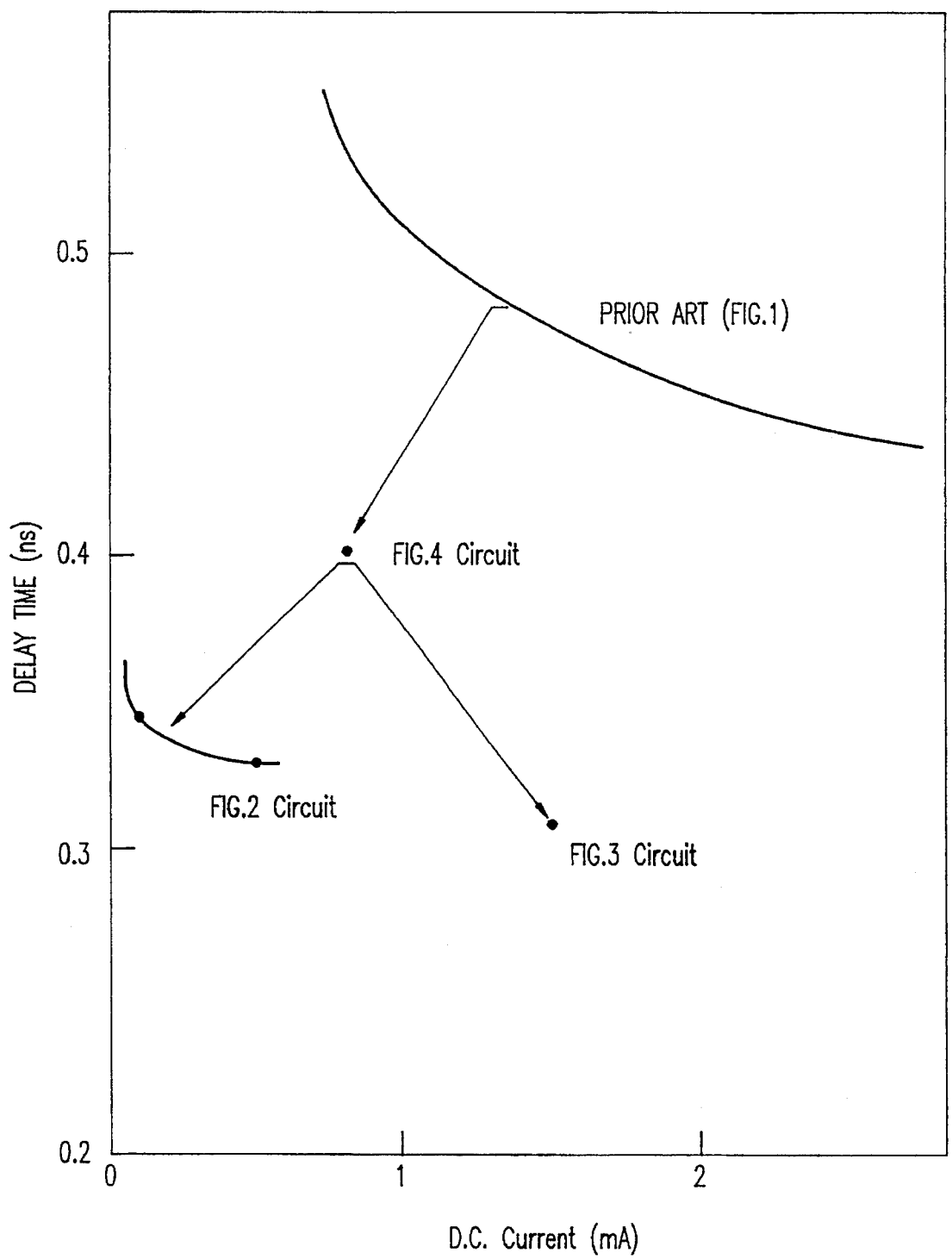
FIG. 9 is a graph indicative of a conversion delay time to power consumption of the circuits shown in FIGS. 1–4.

Referring to FIG. 9, there is shown a comparison among the circuits indicated in FIGS. 1-4 with respect to the conversion delay time to the d.c. current (i.e, power consumption).

Figure 5:
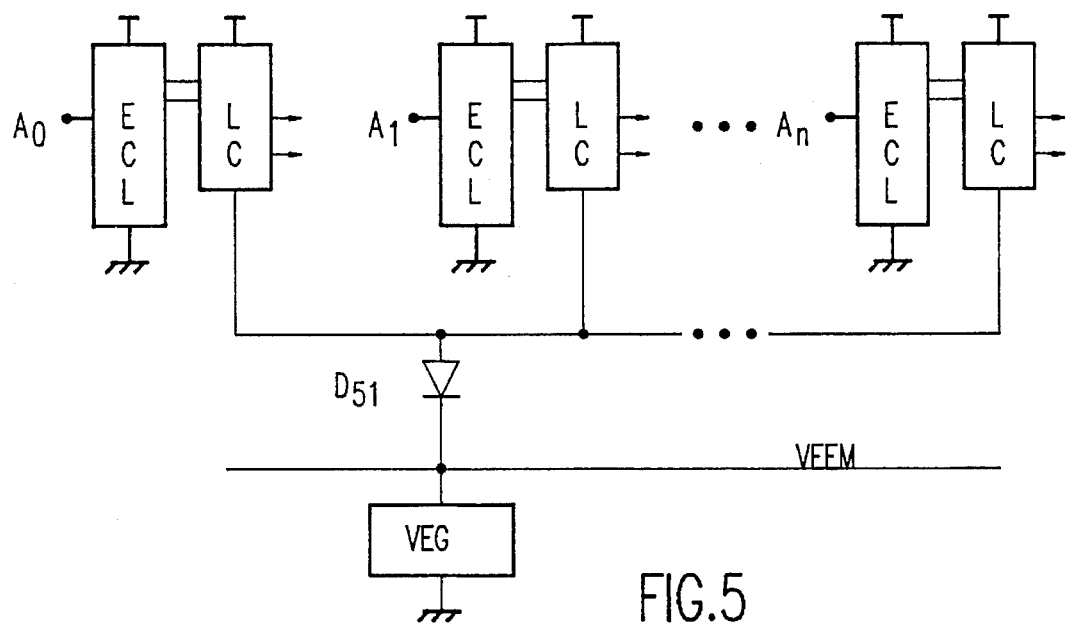
FIG. 5 is a block diagram illustrative of a logic circuit including a level conversion circuit according to the present invention.

Turning to FIG. 5, there is shown a logic circuit having a plurality of level conversion circuit according to the present invention. Each of the level conversion circuits is of any type shown in FIG. 2, 3 or 4. However, the diode D11 is omitted from each conversion circuit, and a diode D51 is provide in common to the level conversion circuits, instead. Further, there is provide a voltage generator VEG to supply a stabilized level VEEM to the second voltage line.

It is apparent that the present invention is not limited to the above embodiments, but may be modified and changed without departing from the scope and spirit of the invention. For example, when only one output signal OUT or OUTB is required, a circuit portion for deriving the other output signal can be omitted. The conductivity type of each bipolar transistor and the channel type of each MOS transistor can be replaced in accordance with the polarities of the first and second voltage level.

What is claimed is:

1. A level conversion circuit for convening a first signal having a first amplitude into a second signal having a second amplitude that is larger than said first amplitude, said circuit comprising:

an input node supplied with said first signal, an output node from which said second signal is derived, a first voltage line, a second voltage line, a first transistor of a bipolar type having a base connected to said input node, a collector connected to said first voltage line and an emitter, a second transistor of a field effect type and of a first channel type having a source-drain path connected between the emitter of said first transistor and said output node and a gate supplied with a bias voltage, a third transistor of a field effect type and of a second channel type opposite to said first channel type having a source-drain path connected between said output node and said second voltage line and a gate supplied with an inverted signal of said first signal, a fourth transistor of a field effect type and of said second channel type having a source-drain path connected in parallel to the source-drain path of said third transistor and a gate supplied with an inverted signal of said second signal.

2. The circuit as claimed in claim 1, further comprising a PN junction diode inserted between the source-drain path of said third transistor and said second voltage line.

3. The circuit as claimed in claim 2, further comprising a current source connected between the emitter of said first transistor and said second voltage line.

4. The circuit as claimed in claim 2, wherein the gate of said second transistor is connected to said second voltage line to receive a voltage level at said second voltage line as said bias voltage.

5. A level conversion circuit for converting an input signal having a first amplitude into first and second output signals each having a second amplitude that is larger than said first amplitude, said first output signal having a phase opposite to said second output signal, said circuit comprising:

an input node supplied with said input signal, a buffer connected to said input node to receive said input signal and producing first and second intermediate signals having phases opposite to each other, first and second voltage lines, a first transistor of a bipolar type and of a first conductivity type having a base supplied with said first intermediate signal, a collector connected to said first voltage line and an emitter, a second transistor of a bipolar type and of said first conductivity type having a base supplied with said second intermediate signal, a collector connected to said first voltage line and an emitter, a first output node from which said first output signal is derived, a second output node from which said second output signal is derived, a third transistor of a field effect type and of a first channel type having a source-drain path connected between the emitter of said first transistor and said first output node and a gate supplied with a bias voltage, a fourth transistor of a field effect type and of said first channel type having a source-drain path connected between the emitter of said second transistor and said second output node and a gate supplied with said bias voltage, a fifth transistor of a field effect type and of a second channel type opposite to said first channel type having a source-drain path connected between said first output node and a circuit node and a gate supplied with said second intermediate signal, a sixth transistor of a field effect type and of said second channel type having a source-drain path connected between said second output node and said circuit node and a gate supplied with said first intermediate signal, a PN junction diode coupling said circuit node to said second voltage line, a seventh transistor of a field effect type and of said second channel type having a source-drain path connected in parallel to the source-drain path of said fifth transistor and a gate connected to said second output node, and an eighth transistor of a field effect type and of said second channel type having a source-drain path connected in parallel to the source-drain path of said sixth transistor and a gate connected to said first output node.

6. The circuit as claimed in claim 5, further comprising a first current source connected between the emitter of said first transistor and said second voltage line and a second current source connected between the emitter of said second transistor and said second voltage line.

7. The circuit as claimed in claim 5, wherein said buffer includes ninth and tenth transistors each of a bipolar type and of said first conductivity type connected in a differential form to produce said first and second intermediate signals.

8. The circuit as claimed in claim 5, wherein the gates of said second and third transistors are connected to said second voltage line to receive a voltage level at said second voltage line as said bias voltage.

* * * * *